United States Patent
Lockstedt et al.

(10) Patent No.: US 10,276,297 B2
(45) Date of Patent: Apr. 30, 2019

(54) HOLDING DEVICE FOR A ROGOWSKI COIL

(71) Applicant: Phoenix Contact GmbH & Co. KG, Blomberg (DE)

(72) Inventors: Kay Lockstedt, Hameln (DE); Rainer Gockel, Bad Pyrmont (DE); Markus Becker, Paderborn (DE); Andreas Senger, Altenbeken (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 667 days.

(21) Appl. No.: 14/488,394

(22) Filed: Sep. 17, 2014

(65) Prior Publication Data

US 2016/0055963 A1 Feb. 25, 2016

(30) Foreign Application Priority Data

Aug. 25, 2014 (DE) .................... 10 2014 112 105

(51) Int. Cl.
*H01F 27/30* (2006.01)
*G01R 1/04* (2006.01)
*G01R 15/18* (2006.01)

(52) U.S. Cl.
CPC .............. *H01F 27/30* (2013.01); *G01R 1/04* (2013.01); *G01R 15/181* (2013.01)

(58) Field of Classification Search
CPC ......... H01F 27/30; G01R 1/04; G01R 15/181; G01R 19/0092; G01R 15/18; G01R 15/183; G01R 15/186

USPC ......................................................... 324/127
See application file for complete search history.

(56) References Cited

U.S. PATENT DOCUMENTS

| | | | | |
|---|---|---|---|---|
| 4,855,671 A * | 8/1989 | Fernandes | ............... | G01K 1/024 324/127 |
| 5,012,218 A * | 4/1991 | Haug | ................... | G01R 15/181 324/127 |
| 5,608,334 A * | 3/1997 | Holt | .................... | G01R 1/06705 324/750.22 |
| 5,834,931 A * | 11/1998 | Moore | ............... | G01R 1/06772 324/95 |
| 6,064,192 A * | 5/2000 | Redmyer | ............. | G01R 15/186 324/117 H |
| 6,300,701 B1 * | 10/2001 | Ong | ........................ | F16C 17/24 310/179 |
| 7,265,533 B2 * | 9/2007 | Lightbody | ........... | G01R 15/142 324/126 |
| 7,545,138 B2 * | 6/2009 | Wilkerson | ........... | G01R 15/181 324/126 |

(Continued)

FOREIGN PATENT DOCUMENTS

| CN | 1890571 A | 1/2007 |
|---|---|---|
| CN | 201036156 Y | 3/2008 |

(Continued)

*Primary Examiner* — Christopher P McAndrew
(74) *Attorney, Agent, or Firm* — Leydig, Voit & Mayer, Ltd.

(57) ABSTRACT

A holding device includes a Rogowski coil, where the Rogowski coil includes a line portion wound into a coil. The holding device further includes a housing part into which the Rogowski coil is connected. A fastening part is configured to be releasebly connected to the housing part and is further configured to be attached to a current-conducting means formed for conducting a current.

20 Claims, 10 Drawing Sheets

(56) References Cited

U.S. PATENT DOCUMENTS

| | | | |
|---|---|---|---|
| 8,405,381 B2 * | 3/2013 | Zimmermann | G01R 15/183 324/117 H |
| 2005/0079771 A1 | 4/2005 | Delessert et al. | |
| 2005/0275397 A1 * | 12/2005 | Lightbody | G01R 15/142 324/126 |
| 2006/0176140 A1 * | 8/2006 | Skendzic | H01F 5/003 336/225 |
| 2006/0232265 A1 * | 10/2006 | Fritsch | G01R 15/181 324/142 |
| 2008/0048646 A1 * | 2/2008 | Wilkerson | G01R 15/181 324/127 |
| 2008/0079418 A1 * | 4/2008 | Rea | G01R 15/181 324/117 R |
| 2009/0278647 A1 * | 11/2009 | Buswell | H01F 3/06 336/182 |
| 2010/0156393 A1 * | 6/2010 | Lindholm | G01R 15/181 324/127 |
| 2010/0315066 A1 | 12/2010 | Hashio et al. | |
| 2011/0089933 A1 * | 4/2011 | Javora | G01R 15/142 324/127 |
| 2012/0256617 A1 * | 10/2012 | Moreux | G01R 15/181 324/126 |
| 2013/0082690 A1 | 4/2013 | Hakemeyer et al. | |
| 2013/0257412 A1 * | 10/2013 | Wynne | G01R 15/181 324/127 |
| 2013/0307526 A1 * | 11/2013 | Seal | G01R 11/185 324/105 |
| 2014/0015516 A1 * | 1/2014 | Sorensen | G01R 19/00 324/127 |
| 2014/0132249 A1 * | 5/2014 | Loglisci | G01R 19/0092 324/144 |
| 2014/0167786 A1 * | 6/2014 | Gutierrez | G01R 15/181 324/654 |
| 2014/0253108 A1 * | 9/2014 | Singh | G01R 15/20 324/227 |
| 2014/0333290 A1 * | 11/2014 | Boudreau, Jr. | G01R 15/181 324/123 R |
| 2016/0091533 A1 * | 3/2016 | Soleillant | H02G 7/00 324/127 |

FOREIGN PATENT DOCUMENTS

| | | |
|---|---|---|
| CN | 101952732 A | 1/2011 |
| DE | 19811366 A1 | 9/1999 |
| DE | 102010012834 A1 | 9/2011 |

\* cited by examiner

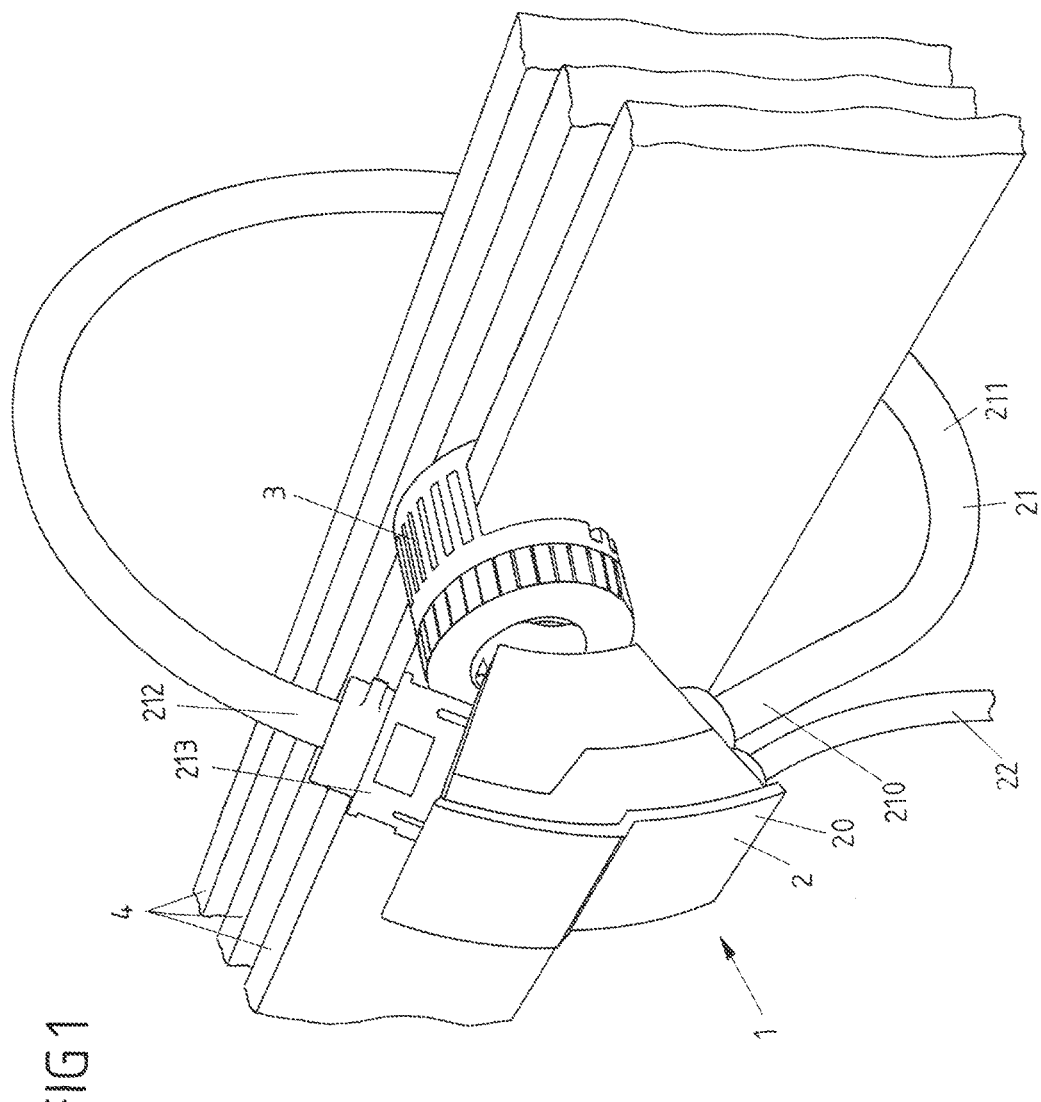

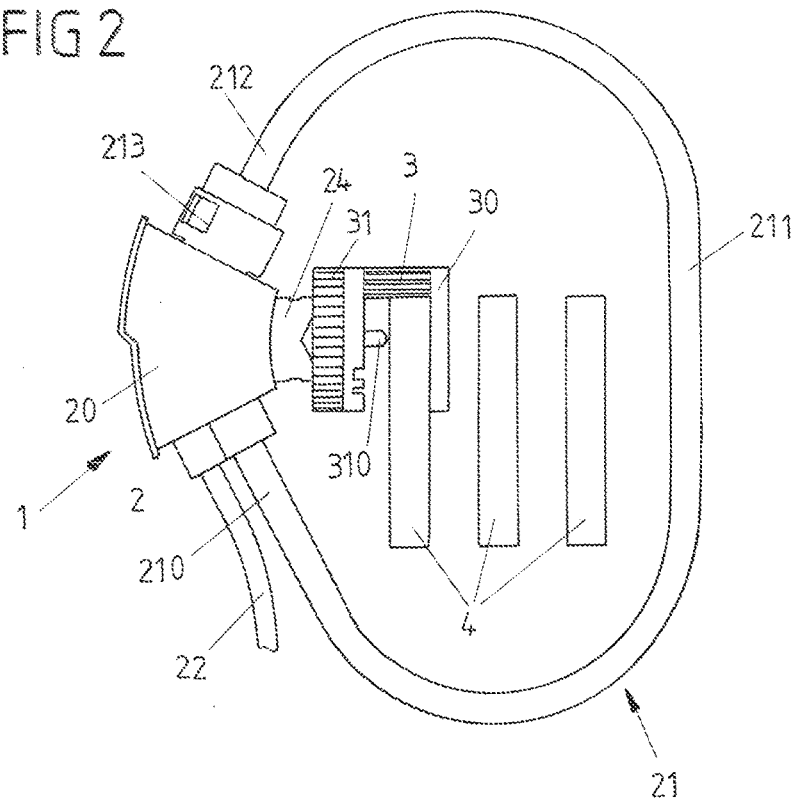
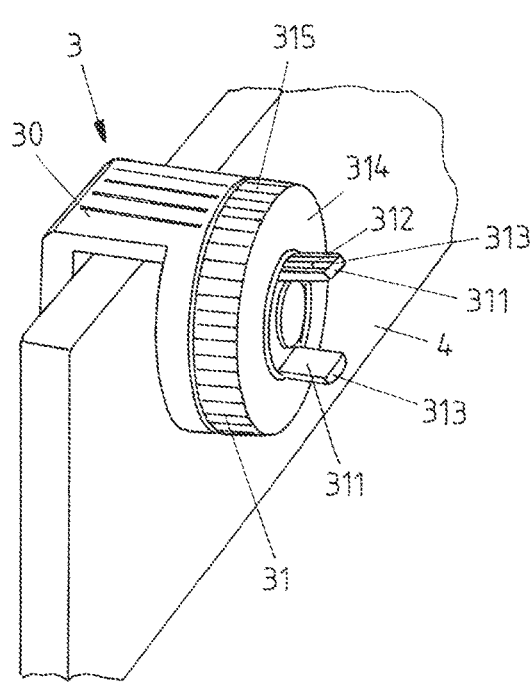

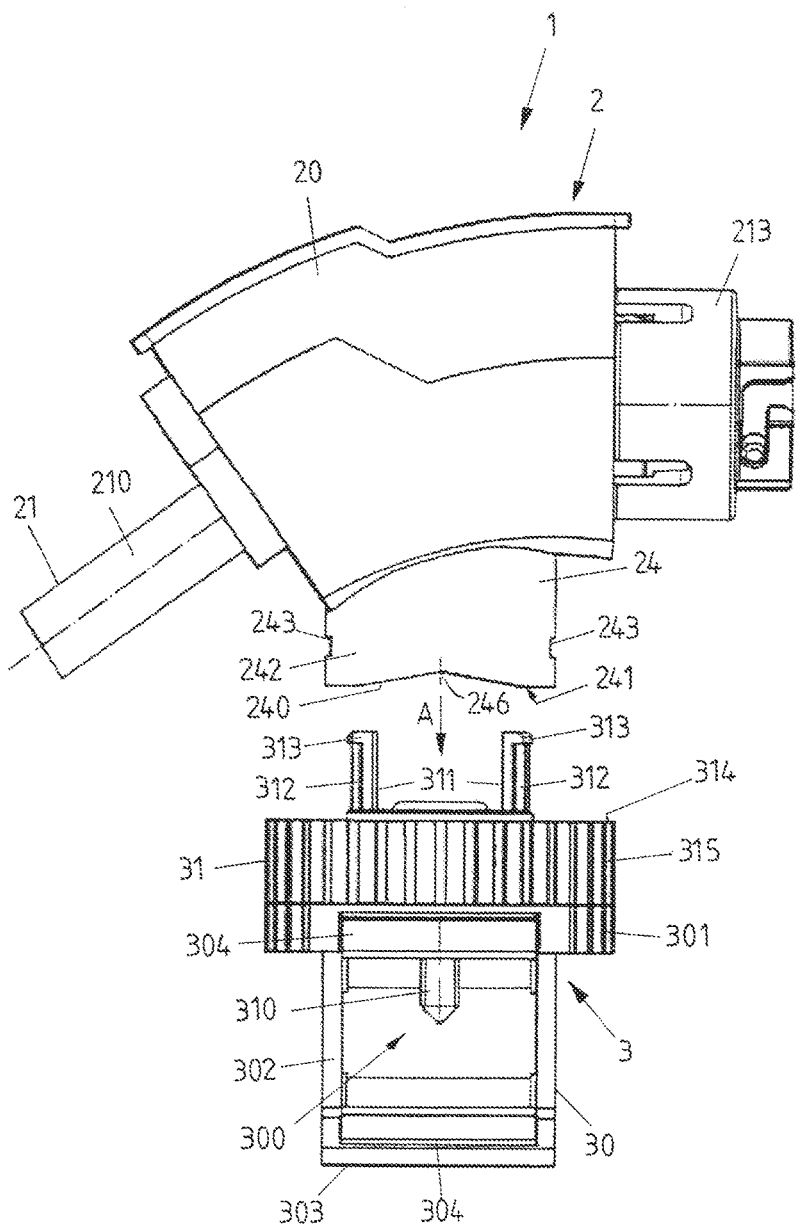

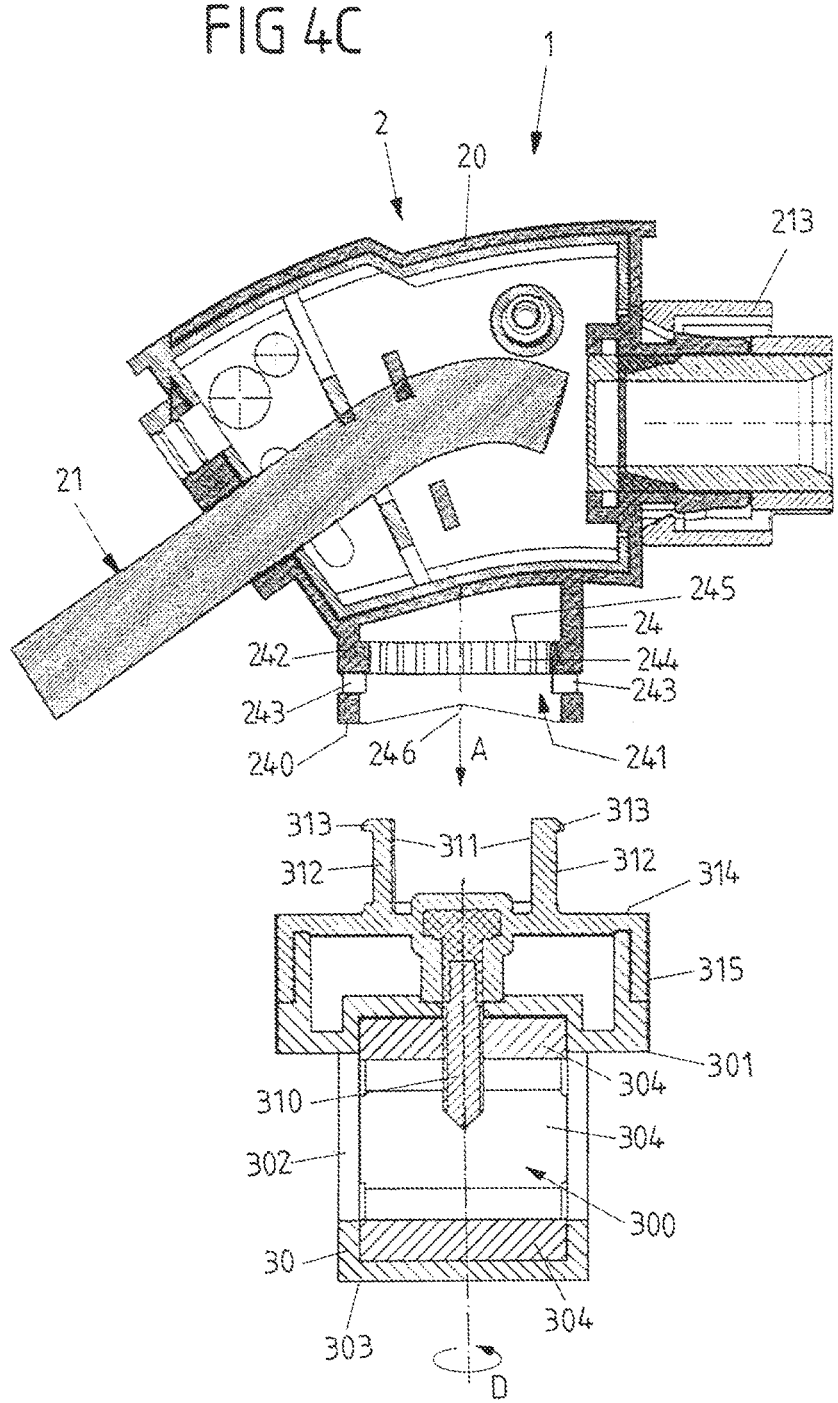

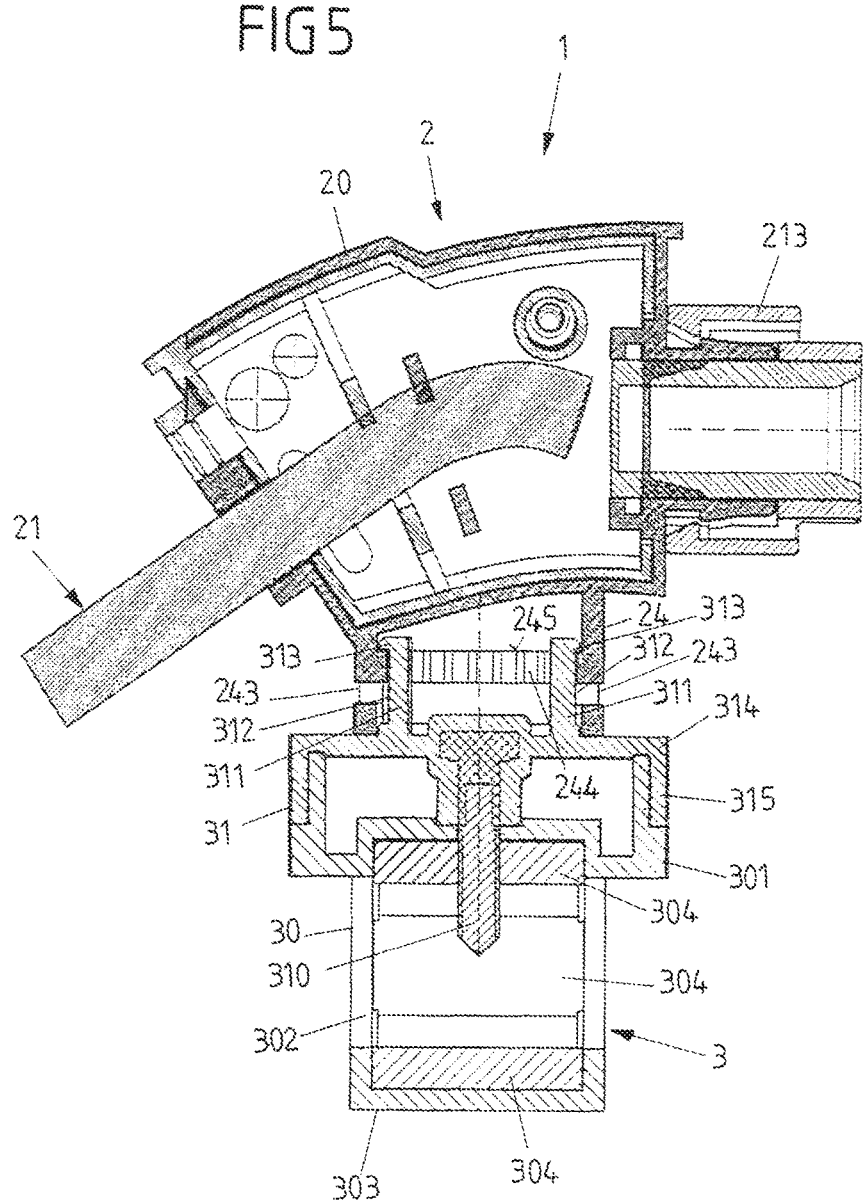

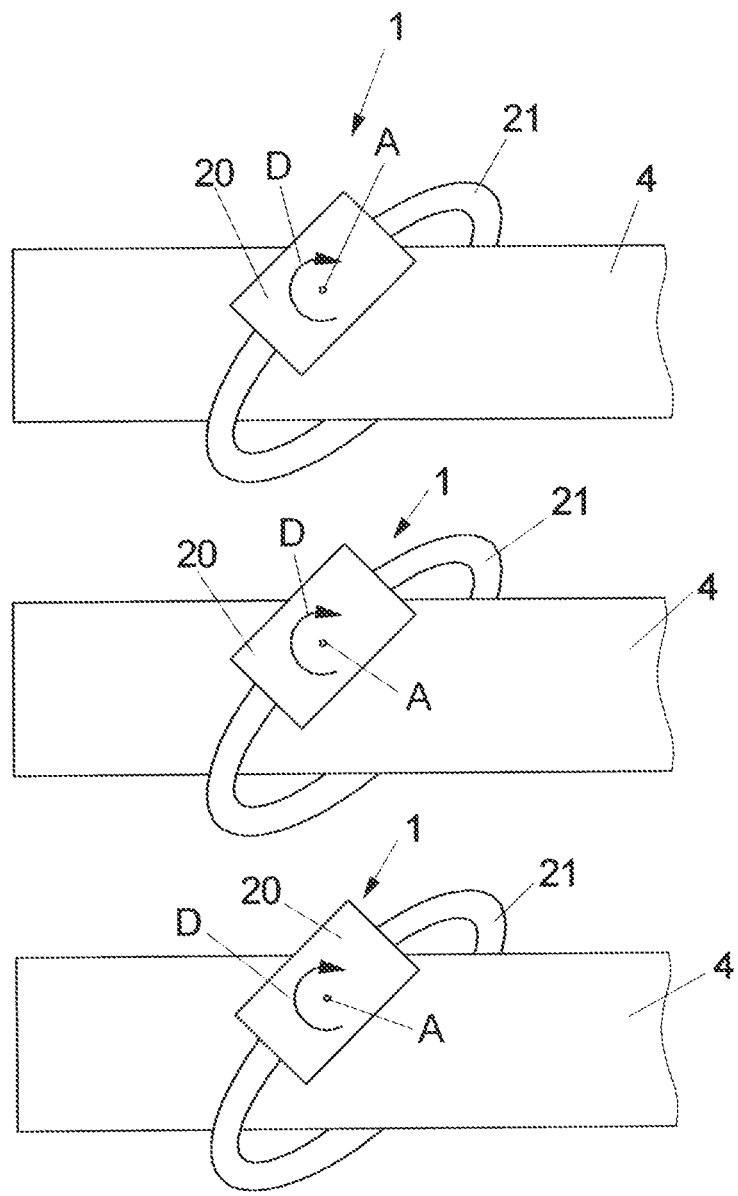

HOLDING DEVICE FOR A ROGOWSKI COIL

CROSS-REFERENCE TO RELATED APPLICATIONS

This application claims priority from German Patent Application No. DE 10 2014 112 105.8 filed Aug. 25, 2014, which is hereby incorporated by reference herein in its entirety.

FIELD

The invention relates to a holding device for fastening a Rogowski coil to a current-conducting means.

BACKGROUND

A holding device comprises a Rogowski coil which has a conducting portion wound into a coil and which is connected to a housing part of the holding device.

A Rogowski coil is understood to be a toroidal coil which (generally) does not comprise a ferromagnetic core. A Rogowski coil comprises a conductor wire which is wound around a body (of a non-ferromagnetic material), both terminals of the coil being arranged at an end of the body and one terminal being fed back to the other terminal along the body in a magnetically neutral manner for this purpose. A Rogowski coil is used for measuring alternating current and for this purpose is laid around a current-carrying current-conducting means, for example a cable core or a busbar, for example in a switch cabinet.

Rogowski coils of this type are also used for example on busbars which carry large currents during operation and can heat to comparatively high temperatures, for example over 100° C. If a Rogowski coil touches the busbar, the hot temperatures in the busbar can potentially lead to damage to the Rogowski coil, in particular to a plastics material casing of the Rogowski coil, if it is not designed for such hot temperatures.

In addition, if a Rogowski coil is laid around a busbar this can potentially lead to the Rogowski coil slipping or otherwise changing position relative to the busbar, and this can affect measurement results obtained using the Rogowski coil.

DE 198 11 366 A1 describes a current sensor which comprises a Rogowski coil which can be laid around a conductor. The current sensor can be arranged with a sensor housing on a plurality of conductors.

DE 10 2010 012 834 A1 describes a Rogowski coil which is to be laid around a conductor. The Rogowski coil is part of a measurement arrangement and is connected to an integrator circuit for generating a voltage signal proportional to the alternating current detected using the Rogowski coil.

SUMMARY

In an embodiment, the present invention provides a holding device including a Rogowski coil, where the Rogowski coil includes a line portion wound into a coil. The holding device further includes a housing part into which the Rogowski coil is connected. A fastening part is configured to be releasably connected to the housing part and is further configured to be attached to a current-conducting device configured to conduct a current.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIG. 1 is a view of an embodiment of a holding device for applying a Rogowski coil to a current-conducting means in the form of a busbar;

FIG. 2 is a side view of the arrangement of FIG. 1;

FIG. 3 is a separate, perspective view of a fastening part of the holding device on a busbar;

FIG. 4B is a side view of the arrangement of FIG. 4A;

FIG. 4C is a longitudinal sectional view of the arrangement of FIG. 4B;

FIG. 5 is a longitudinal sectional view of the holding device when the housing part is attached to the fastening part;

FIG. 7 is a view of the holding device, when a housing part is attached to a round current conductor without the use of a fastening part;

DETAILED DESCRIPTION

Figure 4A:
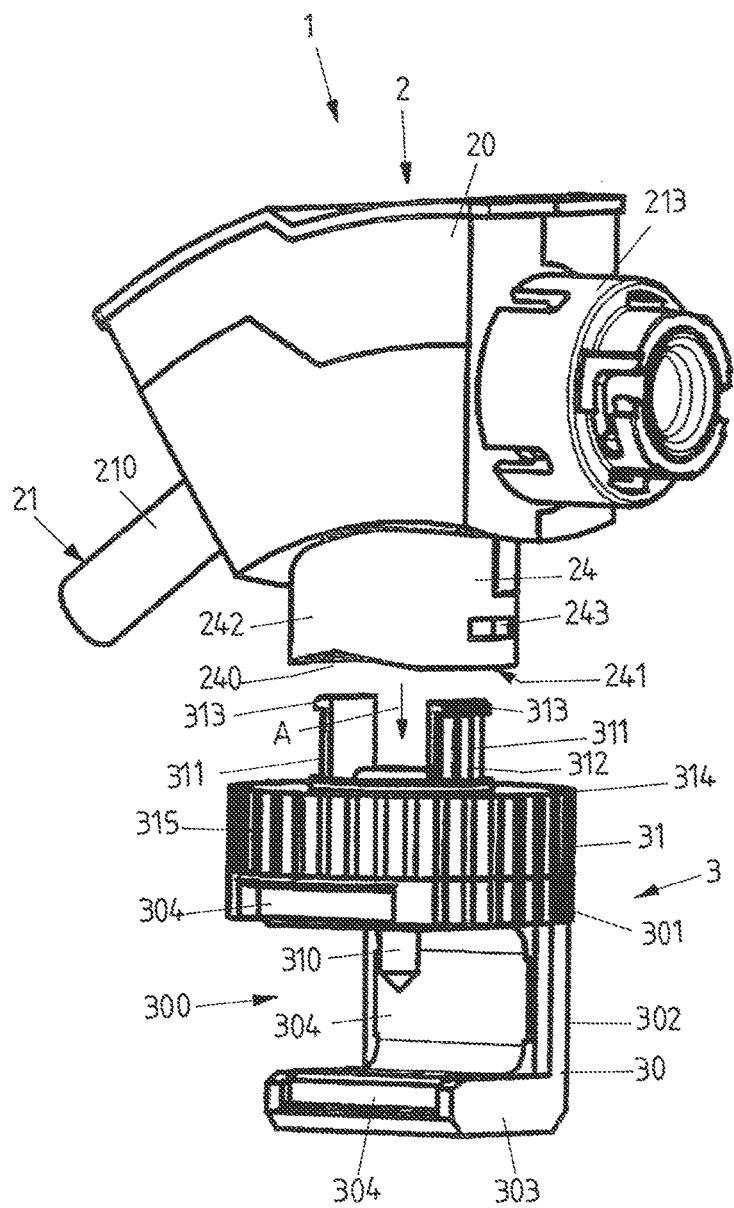
FIG. 4A is a perspective view of the holding device before a housing part is attached to the fastening part.

In an embodiment, the present invention provides a holding device for a Rogowski coil which provides a defined support and a defined position of the Rogowski coil on a current means and which makes contact-free fastening of the Rogowski coil to the current-conducting means possible.

Accordingly, the holding device comprises a fastening part which can be attached to a current-conducting means formed for conducting a current and which can be releasably connected to the housing part.

This is based on the idea of dividing the holding device in two in functional terms. Thus, on the one hand the holding device comprises a housing part to which the Rogowski coil is connected. On the other hand, the holding device comprises a fastening part which can be attached to the current-conducting means and thus serves to fasten the holding device on the current-conducting means. Because the housing part can be releasably connected to the fastening part, the fastening part can initially be fastened to the current-conducting means without the housing part, in other words without the Rogowski coil which is connected to the housing part, so as subsequently to attach the housing part with the Rogowski coil arranged thereon to the fastening part. Because the housing part is releasable from the fastening part, the Rogowski coil can be removed from the current-conducting means again as required by removing the housing part from the fastening part.

For connection to the fastening part, the housing part can for example be attached to the fastening part in an attachment direction. In this case, when connected the housing part is in particular positively connected to the fastening part.

In an advantageous configuration, when connected the housing part can be twisted in a rotation direction, for example directed around the attachment direction, with respect to the fastening part. This makes it possible to adapt the position of the housing part, together with the Rogowski coil arranged thereon, relative to the fastening part, in such a way that the Rogowski coil can for example be applied to a current-conducting means in such a way that it does not touch the current-conducting means, for example a busbar. By twisting the housing part relative to the fastening part, it is possible to change the position of the Rogowski coil relative to the current-conducting means, the Rogowski coil advantageously being laid in a plane in which the axis of rotation extends about which the housing part can be twisted relative to the fastening part.

For connecting the housing part to the fastening part, the housing part or the fastening part comprises at least one latch element, which can be brought into latching engagement with an associated positive fit element of the respective other part, in other words of the fastening part or the housing part, by attaching the housing part to the fastening part. Attaching the housing part to the fastening part establishes a positive fit between the at least one latch element and the positive fit element, in such a way that when connected the housing part is positively fixed to the fastening part. When the housing part is attached to the fastening part, the latch element snaps into engagement with the positive fit element, in such a way that when connected the housing part is axially fixed on the fastening part counter to the attachment direction whilst still being twistable relative to the fastening part.

In a specific configuration, the housing part may comprise an attachment element by means of which the housing part can be attached to the fastening part. The attachment element may for example be cylindrical in form and protrude in the attachment direction from a housing body of the housing part.

On the end thereof remote from the housing body, the attachment element comprises for example an opening into which at least one latch element of the fastening part can be inserted and in which a positive fit element for engaging with the at least one latch element of the fastening part is arranged. The attachment element can thus be placed with the opening thereof on one or more latching elements on the fastening part, resulting in a positive fit being established between the positive fit element of the attachment element and the one or more latch elements of the fastening part, in such a way that the housing part is positively held on the fastening part.

In this context, the attachment element may be formed in such a way that in principle it is also possible to attach the housing part to a current conductor without using the fastening part. In particular, the attachment element may be formed with a concave shape on an edge portion remote from the housing body, in such a way that the edge portion of the attachment element can be attached to a round current conductor. The housing part together with the Rogowski coil arranged thereon can thus in principle also be used without the fastening part. This further increases the variability of the holding device for fastening the Rogowski coil to a current-conducting means.

To make it possible to fasten the housing part to a current-conducting means independently of the fastening part, one or more fastening openings, through which a fastening means, for example a cable tie, can be passed, may be provided on the attachment element. The fastening openings may be applied to the attachment element in such a way that a fastening means, for example a cable tie, can be laid around a current conductor in a favourable manner.

So as to adjust the position of the Rogowski coil relative to the current-conducting means in a desired manner when the fastening part is attached to a current-conducting means, when connected the housing part may, as stated previously, be twistable relative to the fastening part. This makes flexible adjustment of the Rogowski coil relative to the current-conducting means possible when the housing part is connected to the fastening part and thus when the Rogowski coil is already held on the current-conducting means.

In this context, to ensure that the Rogowski coil maintains the adjusted position thereof after the housing part is twisted relative to the fastening part, stiffness in the rotatable connection between the housing part and the fastening part may be provided, and means that after the housing part is twisted relative to the fastening part by a user the housing part maintains the rotational position thereof and does not rotate back again for example. For this purpose, a ratchet toothing may for example be provided on the housing part or the fastening part, which is engaged with an associated ratchet element of the respective other component, in other words the fastening part or the housing part, when the housing part is connected. In this context, the engagement is such that when connected the housing part and the fastening part can be twisted with respect to one another by a user in a ratcheted manner in that the ratchet element is moved by way of the ratchet toothing.

A ratchet toothing may for example comprise a number of teeth in periodic succession, rounded at the tips thereof, which are in engagement with a ratchet element, for example another ratchet toothing. In this context, the shaping of the ratchet toothing is such that when a force exceeding a predetermined threshold is applied to the housing part, the ratchet element can be moved past the ratchet toothing and it is thus possible to adjust the housing part relative to the fastening part. If no force or only a very small force acts on the housing part, the housing part is held in the adjusted rotational position thereof relative to the fastening part by way of the engagement of the ratchet toothing with the ratchet element, in such a way that the position of the Rogowski coil is fixed.

In one configuration, the fastening part may comprise a holding element and a connection element which is adjustable with respect to the holding element. The holding element serves to attach the fastening part to a current-conducting means, and may for this purpose comprise a suitable receiving opening into which the current-conducting means can be inserted.

The connection element may for example comprise a gripping element, it being possible to adjust the gripping element relative to the holding element by adjusting the connection element relative to the holding element, so as to establish a gripping connection of the holding element to a current-conducting means attached to the holding element.

The gripping element may for example be in the form of a pin which projects into the receiving opening of the holding element. By adjusting the connection element relative to the holding element, the position of the gripping element in the receiving opening can be varied, in such a way that the holding element can be jammed together with the current-conducting means.

The receiving opening on the holding element may for example be made U-shaped. For this purpose, the holding element may for example comprise a body, a base arranged on the body, and a leg adjacent to the base. The body and the leg form side legs of a U shape, which is completed by the base. By means of the U-shaped receiving opening, the holding element can be attached to a current conductor of for example rectangular cross section, for example a busbar, it being possible to establish a gripping connection between the holding element and the current-conducting means in the receiving opening by way of the gripping element of the connection element.

In one configuration, a bracket element made of metal is inserted into the receiving opening, and provides a contact face for contacting the holding element with the current-conducting means. When the holding element is attached to a current-conducting means, the bracket element is in contact with the current-conducting means, for example a busbar. Because the element is made of metal, it can provide a secure seat for the holding element on a busbar even in the event of potentially high temperatures in the busbar.

In this context, the receiving opening may for example be formed in such a way that when the holding element is placed on a current-conducting means only the bracket element is positioned on the current-conducting means, but not other portions of the holding element which are made of another material, for example plastics material.

The Rogowski coil is connected to the housing part. In this context, a first end of the Rogowski coil may be rigidly connected to the housing part, whilst the other, second end of the Rogowski coil may be releasably attached to the housing part. Because one end of the Rogowski coil can be connected releasably to the housing part, the Rogowski coil can advantageously be laid around a current-conducting means, for example a busbar, so as subsequently to connect the second end of the Rogowski coil to the housing part and thus to fix the position of the Rogowski coil in the extension thereof around the current-conducting means.

The (releasable) connection of the second end of the Rogowski coil to the housing part may for example be provided by way of a mechanical locking device, for example a bayonet lock. The locking device provides mechanical fixing of the second end of the Rogowski coil to the housing part, but does not provide electrical connection.

In one configuration of the holding device, evaluation electronics for evaluating signals obtained by means of the Rogowski coil are enclosed in the housing part. The Rogowski coil may for example be configured for high-resistance measurement of a voltage induced in the Rogowski coil. By way of the evaluation electronics, a voltage induced in the Rogowski coil is received and evaluated, so as to draw a conclusion, by way of the induced voltage, as to an alternating current carried in the current-conducting means.

As stated, the holding device can in principle also be used without a fastening part, by attaching the housing part to a current-conducting means. In this case, the holding device comprises a Rogowski coil, which comprises a line portion wound into a coil and a housing part to which the Rogowski coil is connected. The housing part comprises an attachment element, which is concavely formed at an edge portion in such a way that the edge portion of the attachment element can be attached to a current-conducting means of a round conducting cross section, and comprises at least one opening as a feedthrough for a fastening means for fastening the housing part to a current-conducting means of a round conducting cross section.

Because of the concave shaping of the edge portion of the attachment element, the housing part can be attached directly—without using a fastening part—to a current-conducting means of a round conducting cross section. The concave shaping of the edge portion may be adapted to a round current conductor of a particular diameter. However, the concave shaping may also form an indentation or the like in such a way that the housing part can be attached, via the edge portion of the attachment element, to current conductors of different diameters.

FIGS. 1 and 2 show a holding device 1, by means of which a Rogowski coil 21 can be fixed to one or more current-conducting means 4, for example busbars of a switch cabinet or the like.

The holding device 1 comprises a housing part 2, which is releasably connected to a fastening part 3 and carries the Rogowski coil 21. The fastening part 3 can be attached to a current-conducting means 4, in such a way that the holding device 1 can be fastened to the current-conducting means 4 by means of the fastening part 3.

A first end 210 of the Rogowski coil 21 is rigidly mechanically connected to a housing body 20 of the housing part 2, and this end 210 is electrically connected to evaluation electronics 23 via terminals 230, 231. The other, second end 212 of the Rogowski coil 21 is releasably connected to the housing body 20 of the housing part 2 via a mechanical locking means 213, for example in the form of a bayonet lock, in such a way that the Rogowski coil 21 can be laid around the current-conducting means 4 when the second end 212 is released and can subsequently be mechanically fixed to the housing part 2 via the locking device 213.

Figure 9:
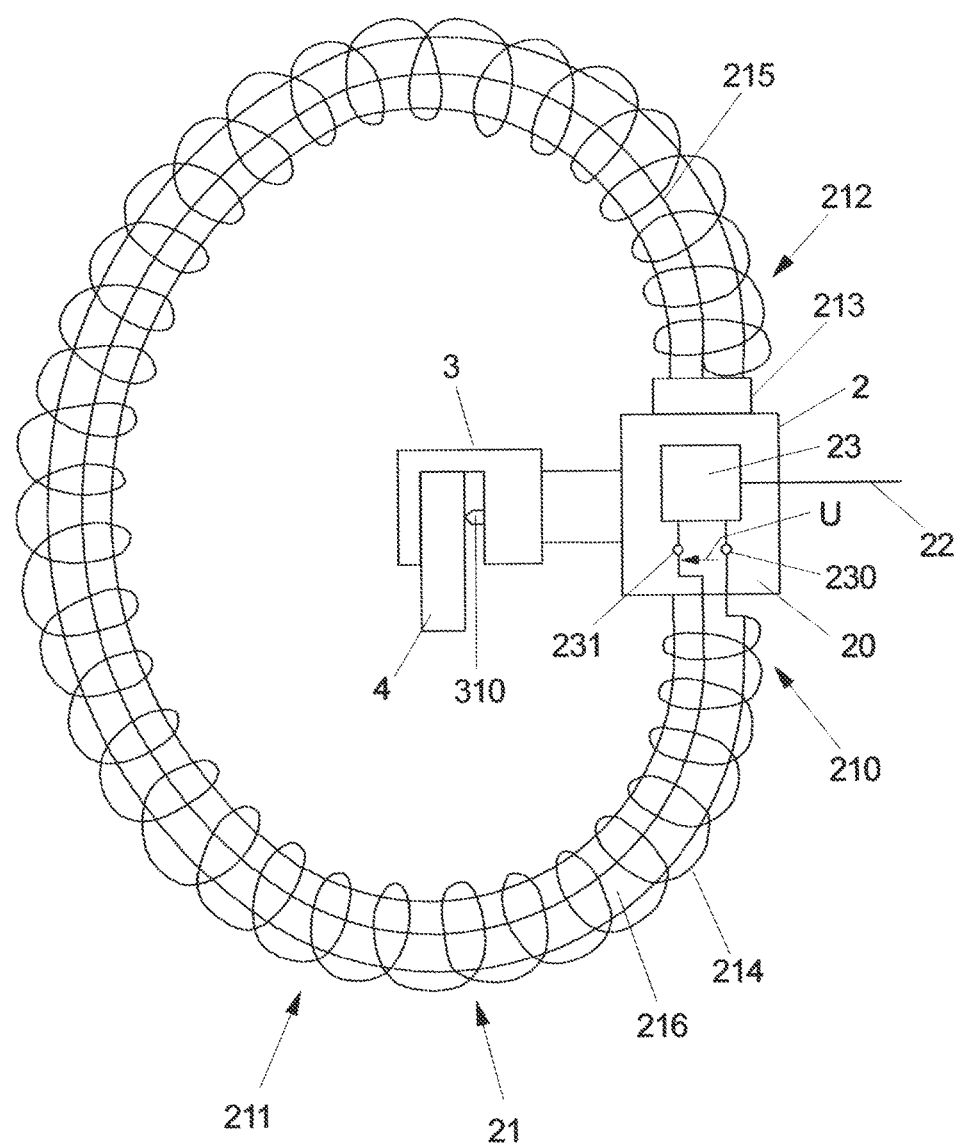
FIG. 9 is a schematic view of a Rogowski coil.

The Rogowski coil 21, shown schematically in FIG. 9, is formed by a conductor wire, which is wound around a solid, non-ferromagnetic body 216. In this context, a first line portion 214 of the conductor wire is wound around the body 216 in a uniform shape, and the first end 210 of the Rogowski coil 21 is connected to a first terminal 230 of the evaluation electronics 23, whilst a second line portion 215 is fed back from the second end 212 of the Rogowski coil 21 to the first end 210 in a magnetically neutral manner along the body 216 and is connected to a second terminal 213 of the evaluation electronics 23. In operation, an alternating current carried in the current-conducting means 4 induces a voltage U in the Rogowski coil 21, which voltage can be tapped between the terminals 230, 231 and evaluated in the evaluation electronics 23 so as to output, via a terminal line 22, a sensor signal which indicates the alternating current carried in the current-conducting means 4. In a further embodiment, the voltage tapped between the terminals 230, 231 is passed on via the terminal line 22 to evaluation electronics (not shown) arranged outside the housing 2.

The actual coil 211, in which a voltage which is present at the terminals 230, 231 and can accordingly be tapped is induced in operation as a result of an alternating current in the current-conducting means 4, extends between the ends 210, 212 of the Rogowski coil 21.

The body 216 of the Rogowski coil 21 is advantageously bendable in such a way that the Rogowski coil 21 can flexibly be laid around one or more current-conducting means 4, for example busbars extending mutually parallel, as is shown in FIGS. 1 and 2.

The Rogowski coil 21 may comprise a casing, for example a plastics material casing, in such a way that the conductor wire forming the conducting portions 214, 215 is not visible from the outside.

As stated, the holding device 1 comprises a housing part 2 on which the actual Rogowski coil 21 is arranged and a fastening part 3 which is provided for fixing to a current-conducting means 4.

As can be seen from FIG. 3 and FIG. 4A-4C, the fastening part 3 comprises a holding element 30 and a connection element 31 which can be twisted with respect to the holding element 30. The holding element 30 forms a receiving opening 300 of a U-shaped cross section, formed by a base 302 adjacent to a body 301 and a leg 303 arranged thereon. A bracket element 304 made of metal is inserted into the U-shaped receiving opening 300, and provides a contact surface for the current-conducting means 4 when the fastening part 3 is attached to a current-conducting means 4.

The connection element 31 can be twisted around an attachment direction A (see for example FIG. 4A) relative to the body 301 of the holding element 30. As can be seen from the longitudinal sectional view of FIG. 4C, the connection element 31 comprises a gripping element 310, which is rigidly connected to a body 314 of the connection element 31, is configured in the manner of a screw, and is in a threaded engagement with a feedthrough opening provided in the bracket element 304 in such a way that the gripping element 310 can be adjusted relative to the bracket element 304 by twisting the connection element 31 relative to the holding element 30. The gripping element 310 projects into the receiving opening 300, and makes it possible to jam the bracket element 304 together with a current-conducting element 4 arranged therein.

The body 314 has a corrugation on a peripheral wall 315 extending around the attachment direction A, in such a way that a user can twist the connection element 31 relative to the holding element 30 by gripping on the peripheral wall 315.

The housing part 2 can be attached to the fastening part 3 in the attachment direction A. For this purpose, the housing part 2 comprises an attachment element 24 of a cylindrical base shape, which is adjacent to the housing body 20 in the attachment direction A and which forms an opening 241 on the end thereof facing the fastening part 3, by means of which opening the attachment element 24 can be attached to latch elements 311 on the connection element 31 of the fastening part 3.

The latch elements 311 protrude from the connection element 31 of the fastening part 3 counter to the attachment direction A. The fastening part 3 comprises two latch elements 311, which are diametrically opposed and each have a catch 313 in the form of an outwardly projecting latch tab on the end thereof remote from the connection element 31. When the housing part 2 is attached to the fastening part 3 in the attachment direction A, the latch elements 311 are introduced into the opening 241 of the attachment element 24, in such a way that the catches 313 of the latch elements 311 come into latching engagement with a positive fit element in the form of an edge 245 of a ratchet toothing 244 inside the opening 241, and thus fix the housing part 2 axially along the attachment direction A relative to the fastening part 3.

When connected, the latch elements 311 are engaged, as shown in FIG. 5, with the edge 245, remote from the fastening part 3, of the ratchet toothing 244 inside the opening 241 of the attachment element 24, in such a way that the housing part 2 is connected to the fastening part 3 in a positive fit.

Figure 6A:
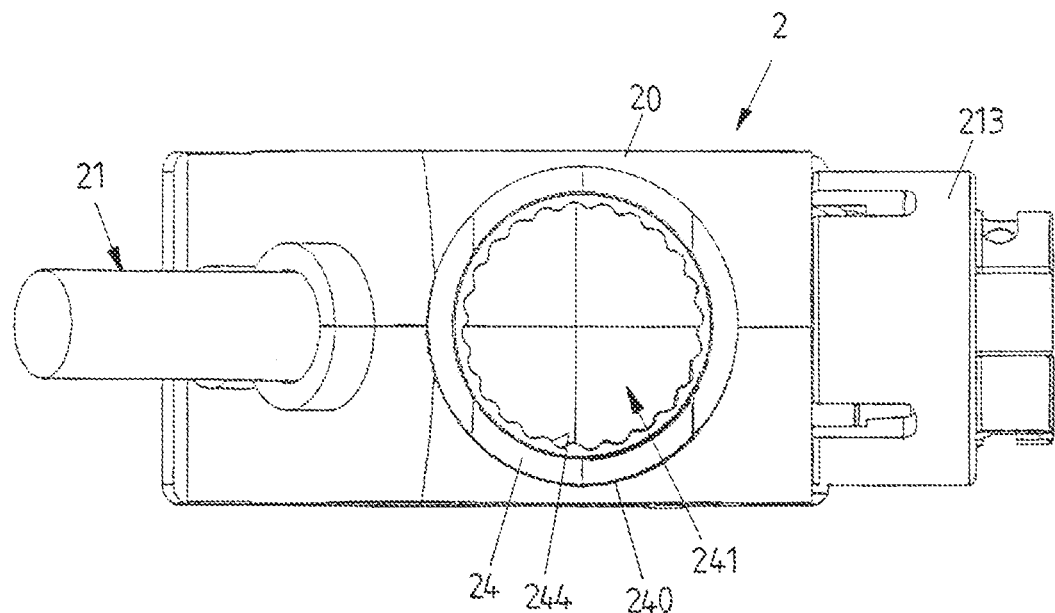
FIG. 6A is a view of the housing part from below, into an opening in an attachment element of the housing part.
Figure 6B:
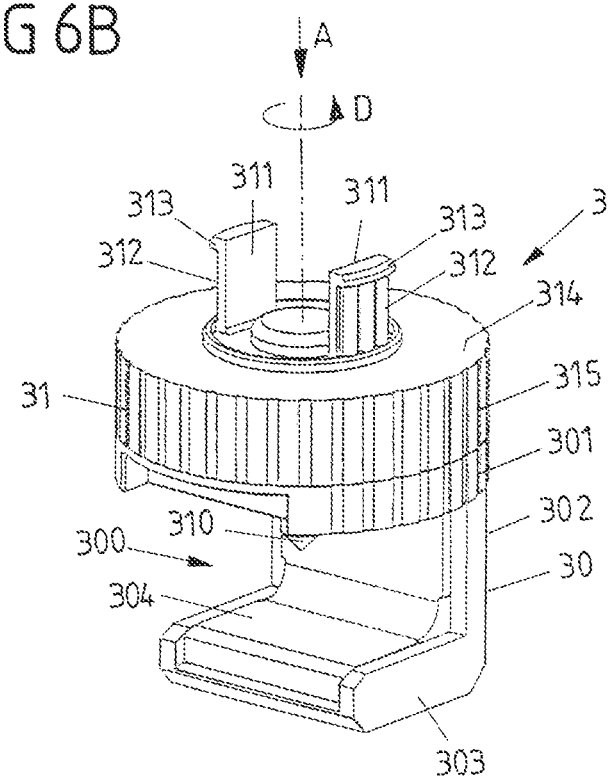
FIG. 6B is a perspective view of the fastening part of the holding device.

The latch elements 311 each comprise ratchet elements 312 in the form of a portion of a ratchet toothing on the outer faces thereof, as can be seen from FIG. 6B. By contrast, the ratchet toothing 244 inside the opening 241 of the attachment element 24 is formed by teeth in periodic succession in the peripheral direction around the attachment direction A, the tips of which are rounded and which are adapted to the ratchet toothing 312 of the latch elements 311. If the housing part 2 is connected to the fastening part 3, as is shown in FIG. 5, the ratchet toothings 312 of the latch elements 311 are engaged with the ratchet toothing 244 inside the opening 241 of the attachment element 24, the engagement being such that the housing part 2 can be twisted in a rotation direction D around the attachment direction A relative to the fastening part 3. During twisting, the ratchet toothings 312 slide on the latch elements 311 of the fastening part 3 in a ratcheting manner over the ratchet toothing 244 of the attachment element 24, in such a way that the housing part 2 can be brought into a desired position with respect to the fastening part 3 and remains in place after the desired position is achieved.

As a result of the engagement of the ratchet toothings 312 on the latch elements 311 with the ratchet toothing 244 inside the opening 241 of the attachment element 24, a number of possible discrete angular positions of the housing part 2 relative to the fastening part 3 are predetermined. For example, as a result of engagement of the ratchet toothings 244, 312 in one another, the housing part 2 can be twisted in 15° steps relative to the fastening part 3.

For application, the fastening part 3 is initially attached to a current-conducting means 4 and brought into gripping connection with the current-conducting means 4 by twisting the connection element 3 relative to the holding element 30. Subsequently, the housing part 2 is attached to the fastening part 3, and a positive connection between the housing part 2 and the fastening part 3 is thereby established. By twisting the housing part 2 in the rotation direction D relative to the fastening part 3, the position of the Rogowski coil 21 relative to the current-conducting means 4 can ultimately be set in a desired manner.

By releasing the housing part 2 from the fastening part 3, the Rogowski coil 21 can also be removed from a current-conducting means 4 again. For this purpose, the second end 212 of the Rogowski coil 21 is released from the housing body 20 by releasing the locking device 213, and subsequently the housing part 2 is withdrawn from the fastening part 3 counter to the attachment direction A.

Because the housing part 2 can be twisted relative to the fastening part 3, the position of the Rogowski coil 21 with respect to a current-conducting means 4 can be adapted in a desired manner. Thus, for example, as is shown schematically in FIG. 7, the current may be measured on a plurality of current-conducting means 4, extending mutually parallel, in the form of busbars, using a plurality of Rogowski coils 21. In this context, so as to make it possible to arrange the Rogowski coils 21 on a current-conducting means 4 without the Rogowski coils 21 touching another current-conducting means 4, the Rogowski coils 21 may each be brought into a for example oblique position, by twisting the housing part 2 in the rotation direction D relative to the fastening part 3 of the respectively associated holding device 1, in such a way that the Rogowski coils 21 can be laid through between adjacent current-conducting means 4. As a result of the holding device 1, the Rogowski coils 21 are held in the desired, adjusted portion thereof, and cannot readily slide or otherwise change position in the subsequent measuring operation.

Figure 8:
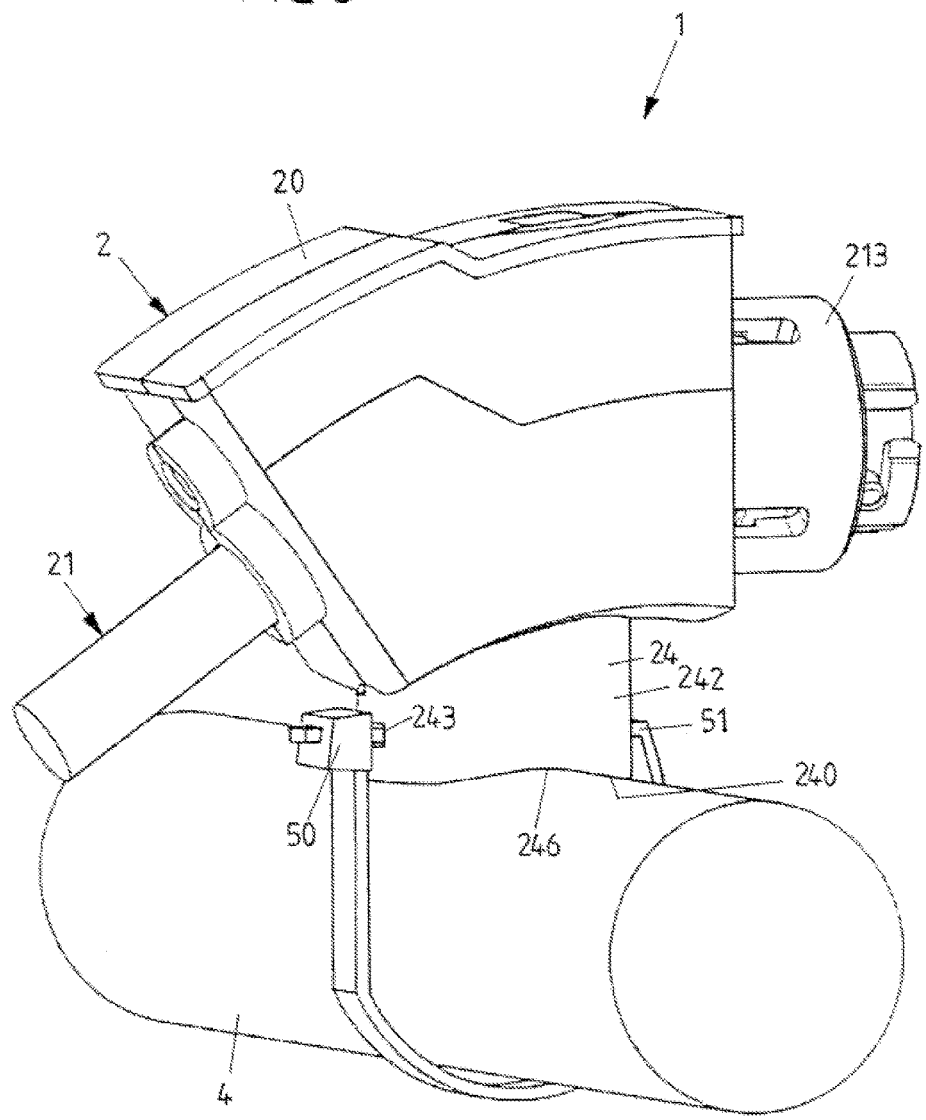
FIG. 8 is a schematic view of the application of a plurality of Rogowski coils to a plurality of busbars.

The holding device 1 can also in principle be used without the fastening part 3. Thus, as shown in FIG. 8, the housing part 2 together with the Rogowski coil 21 arranged thereon can be attached to a current-conducting means 4, for example in the form of a current conductor of a round conducting cross section, by means of the attachment element 24. To provide a defined contact, the attachment element 24 comprises, on the edge portion 240 thereof remote from the housing body 20, a concave shaping which can be adapted for attachment to current-conducting means 4 in the form of current conductors of a round conducting cross section. For example, the lower edge portion 240 may form an indentation 246 which can be attached to a current-conducting means 4, as is shown in FIG. 8.

The attachment element 24 is cylindrical in form and comprises two diametrically opposed fastening openings 243, through which a fastening means 5 in the form of a cable tie can be passed, on the outer generated surface 242 thereof. By means of the fastening means 5, the housing part 2 can be fixed to a current-conducting means 4 by passing a portion 51 of the fastening means 5 in the form of a cable tie through the fastening openings 243 and bringing it into engagement with a press-in lock 50 of the cable tie.

The housing body 20 of the housing part 2 may be formed in one part or also in multiple parts. For example, in one specific configuration, the housing body 2 may be composed of two housing halves, in such a way that the housing body 20 can also be opened for access to the evaluation electronics 23 arranged therein.

The evaluation electronics 23 may in particular provide advance amplification and advance processing of the signals obtained by means of the Rogowski coil 21. From the evaluation electronics 23, sensor signals may for example be transmitted via the terminal line 22 to a superordinate evaluation and control means.

The idea behind the invention is not limited to the embodiments described above, but can also in principle be implemented in a completely different manner in different embodiments.

In particular, a Rogowski coil 21 of the type disclosed herein can be used not only on busbars, but on any desired current-conducting devices in which an alternating current is to be measured. In this context, the length of the Rogowski coil may be adapted in such a way that the Rogowski coil can be laid around one or more current conductors.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

1 holding device
2 housing part
20 housing body
21 Rogowski coil
210 end
211 coil
212 end
213 locking means
214,215 line portion
216 body
22 terminal line
23 evaluation electronics
230,231 terminal
24 attachment element
240 edge portion
241 opening
242 generated surface
243 fastening opening
244 ratchet toothing
245 edge
3 fastening part
30 holding element
300 receiving opening
301 body
302 base
303 leg
304 bracket element
31 connection element
310 gripping element
311 latch elements
312 ratchet toothing
313 catch
314 body
315 peripheral wall
4 current-conducting means
5 fastening means (cable tie)
50 press-in lock
51 portion
A attachment direction
D rotation direction
U voltage

The invention claimed is:

1. A holding device comprising:
   a Rogowski coil, the Rogowski coil including a line portion wound into a coil, and
   a housing part into which the Rogowski coil is connected,
   wherein a fastening part is configured to be releasably connected to the housing part,
   wherein the fastening part is configured to be attached to a current-conducting device configured to conduct a current, and
   wherein the Rogowski coil lays around the current-conducting device so as to surround the current-conducting device.

2. The holding device recited in claim 1, wherein the housing part is configured to be attached to the fastening part in an attachment direction for connection to the fastening part.

3. The holding device recited in claim 1, wherein when the fastening part is connected the housing part, the housing part is positively connected to the fastening part.

4. The holding device recited in claim 1, wherein when the fastening part is connected the housing part, the housing part can be twisted in a rotational direction with respect to the fastening part.

5. The holding device recited in claim 1, wherein the fastening part includes at least one latch element and the housing part includes at least one positive fit element, the latch element being configured to form a latching engagement with the positive fit element by attaching the housing part to the fastening part, the latch element, when connected, being in positive engagement with the positive fit element.

6. The holding device recited in claim 1, wherein the housing part includes an attachment element by which the housing part can be attached to the fastening part.

7. The holding device recited in claim 6, wherein the attachment element includes an opening configured to receive at least one latch element of the fastening part and in which a positive fit element is arranged for engagement with the at least one latch element of the fastening part.

8. The holding device recited in claim 6, wherein the attachment element is formed with a concave shape on an edge portion of the attachment element, such that the edge portion is configured to be attached to the current-conducting device, the current-conducting device having a round conducting cross section.

9. The holding device recited in claim 8, wherein the attachment element includes at least one fastening opening as a feedthrough for a fastening device for fastening the housing part to the current-conducting device.

10. The holding device recited in claim 1, wherein the fastening part comprises a ratchet toothing and the housing part comprises a ratchet element, the ratchet toothing, when connected, being engaged with the associated ratchet element such that the housing part and the fastening part, when connected, are configured to be adjusted with respect to one another in a ratcheted manner, in that the ratchet element can be moved by way of the ratchet toothing.

11. The holding device recited in claim 1, wherein the fastening part includes a holding element, by which the fastening part is configured to be attached to the current-conducting device, and a connection element, which is configured to be adjusted with respect to the holding element and is further configured to be connected to the housing part.

12. The holding device recited in claim 1, wherein the connection element includes a gripping element for fastening the current-conducting device to the holding element, the gripping element being adjustable by adjusting the connection element relative to the holding element.

13. The holding device recited in claim 11, wherein the holding element includes a receiving opening for receiving the current-conducting device.

14. The holding device recited in claim 13, wherein the holding element comprises a body, a base arranged on the body, and a leg adjacent to the base, the body, the base and the leg forming the receiving opening between them, the receiving opening being U-shaped.

15. The holding device recited in claim 14, wherein the holding element comprises a bracket element made of metal and arranged in the receiving opening for contact with the current-conducting device.

16. The holding device recited in claim 1, wherein a first end of the Rogowski coil is rigidly connected to the housing part and a second end of the Rogowski coil can be releasably connected to the housing part.

17. The holding device recited in claim 1, wherein the housing part comprises evaluation electronics for evaluating signals obtained using the Rogowski coil.

18. A holding device comprising:
a Rogowski coil, the Rogowski coil including a line portion wound into a coil; and
a housing part to which the Rogowski coil is connected, wherein the housing part includes an attachment element, the attachment element being concavely formed at an edge portion thereof such that the edge portion is configured to be attached to a current-conducting device having a round conducting cross section, the housing part further including at least one opening as a feedthrough for a fastening device for fastening the housing part to a current-conducting device, and
wherein the Rogowski coil lays around the current-conducting device so as to surround the current-conducting device.

19. The holding device recited in claim 1, wherein the fastening part comprises a ratchet element and the housing part comprises ratchet toothing, the ratchet toothing, when connected, being engaged with the associated ratchet element in such that the housing part and the fastening part, when connected, are configured to be adjusted with respect to one another in a ratcheted manner, in that the ratchet element can be moved by way of the ratchet toothing.

20. The holding device recited in claim 1, wherein the fastening element includes at least one positive fit element and the housing part includes at least one latch element, the latch element being configured to form a latching engagement with the positive fit element by attaching the housing part to the fastening part, the latch element, when connected, being in positive engagement with the positive fit element.

* * * * *